(12) United States Patent
Oku et al.

(10) Patent No.: US 6,307,219 B1
(45) Date of Patent: Oct. 23, 2001

(54) LIGHT-EMITTING DEVICE COMPRISING GALLIUM-NITRIDE-GROUP COMPOUND SEMICONDUCTOR

(75) Inventors: Yasunari Oku, Kagoshima; Hidenori Kamei, Fukuoka, both of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/318,472

(22) Filed: May 25, 1999

(30) Foreign Application Priority Data

May 25, 1998 (JP) .................................................. 10-142681

(51) Int. Cl.[7] .................................................. H01L 33/00
(52) U.S. Cl. .......................... 257/101; 257/103; 257/94; 257/96
(58) Field of Search ................................ 257/94, 96, 101, 257/103, 12, 13

(56) References Cited

FOREIGN PATENT DOCUMENTS

| 06268259A | 9/1994 | (JP) . |
|---|---|---|
| 10145004A | 5/1998 | (JP) . |

*Primary Examiner*—Minh Loan Tran
(74) *Attorney, Agent, or Firm*—Rossi & Associates

(57) ABSTRACT

An n-type clad layer, a light-emitting layer, a p-type clad layer of gallium-nitride-group compound semiconductor are stacked on a substrate in the order. The composition distribution of gallium-nitride-group compound semiconductor forming the p-type clad layer is varied in the direction of layer thickness at a substantially continuous change rate, or it is varied in change rate of the stepping mode, so as the forbidden band width gradually decreases along with an increasing distance from the light-emitting layer. With the above-described structure, the operating voltage is lowered, while the luminous efficiency is improved.

8 Claims, 3 Drawing Sheets

LIGHT-EMITTING DEVICE COMPRISING GALLIUM-NITRIDE-GROUP COMPOUND SEMICONDUCTOR

BACKGROUND OF THE INVENTION

The present invention relates to a light-emitting device comprising a gallium-nitride-group compound semiconductor, used in opto-devices such as a light-emitting diode, a laser diode, etc. More specifically, a semiconductor light-emitting device, with which the operating voltage can be lowered, at the same time, the efficiency of light emission can also be improved.

Gallium-nitride-group compound semiconductors have been increasingly used as semiconductor material for the visible light-emitting devices and the electronic devices of high operating temperature. The development has been significant in the fields of, in particular, blue light-emitting diodes, green light-emitting diodes and blue-purple laser diodes.

A basic method of manufacturing the light-emitting device comprising the gallium-nitride-group compound semiconductor is growing a gallium-nitride-group semiconductor film on the surface of a substrate of sapphire, SiC, etc. by means of metal organic chemical vapor deposition. In a practical process of forming a compound semiconductor layer of gallium-nitride-group, a substrate is placed in a reaction tube; metal organic compound gases, for example tri-methyl-gallium (TMG), tri-methyl-aluminum (TMA), tri-methyl-indium (TMI), as the material gas for the Group III element, and ammonia, hydrazine, etc. as the material gas for the Group V element, are supplied therein. The substrate is maintained at a high temperature 900° C.–1100° C., and an n-type layer, a light-emitting layer and a p-type layer are grown on the substrate in a stacked layer structure. After that, by using the technologies of photolithography, vapor deposition, etc., an n-side electrode and a p-side electrode are formed, respectively, on the n-type layer and the p-type layer. Thus, a light-emitting device is completed.

In the semiconductor light-emitting devices, including those of the gallium-nitride-group compound-semiconductor, a material for forming the light-emitting layer is selected in accordance with a requested wavelength of light-emission. The electron injection from the n-type layer to light-emitting layer and the hole injection from the p-type layer into the light-emitting layer cause a recombination of the electron and the hole within the light-emitting layer to generate a light of a certain desired wavelength.

Among the gallium-nitride-group compound semiconductor light-emitting devices, those having a double hetero junction structure comprising an n-type clad layer of GaN, AlGaN, a light-emitting layer of InGaN and a p-type clad layer of AlGaN are forming the main current of products. FIG. 5 shows the structure of a conventional gallium-nitride-group compound semiconductor light-emitting device.

As shown in FIG. 5, an n-type layer 13 of gallium-nitride (GaN), a light-emitting layer 14 of indium-gallium-nitride (InGaN) and a p-type clad layer 15 of aluminum-gallium-nitride (AlGaN) are stacked on a sapphire substrate 11, with the intermediary of a buffer layer 12, to form double hetero junction structure. Stacked over it is a p-type contact layer 16 of GaN A p-side electrode 17 is formed on the p-type contact layer 16, and an n-side electrode 18 is formed on the surface of the n-type layer 13, which has been exposed as a result of the removal in part of the three layers, viz. p-type contact layer 16, p-type clad layer 15 and light-emitting layer 14.

In the above described gallium-nitride-group compound semiconductor light-emitting device, when a voltage of negative polarity is applied on the n-side electrode 18 and a voltage of positive polarity is applied on the p-side electrode 17, electron is injected from the n-type layer 13 into the light- emitting layer 14, at the same time the hole is injected from the p-type clad layer 15 into the light-emitting layer 14. Thus, the light-emitting layer 14 emits a light having an energy corresponding to the band gap energy of the semiconductor material constituting the light-emitting layer 14. The above structure has been disclosed by, for example, Japanese Laid-open Patent No 6-268259.

The structure containing the double hetero junction provides a significant improvement in the output of the light emission and in the operating voltage, as compared with a conventional light-emitting device of metal - insulator - semiconductor (MIS) structure.

With the improved light-emitting output and the operating voltage, the light-emitting display devices comprising gallium-nitride-group compound semiconductor have now become usable in, for example, the outdoor display application.

However, in the large-size display devices, including those for outdoor use, the clear visibility is readily affected by the strong mid-day sunlight. Therefore, a further increase in the light-emitting output is requested in order to present a better image of higher visibility. Also with the view to curtailing the power consumption of the large outdoor display devices, reduction in the operating voltage of a light-emitting device is asked for.

It is known that the higher the injection efficiency of electron into the light-emitting layer the higher the output of light emission of a light-emitting device; suppressing the overflow of electron into the p-type layer is an effective measure to increase the efficiency of electron injection into the light-emitting layer. In order to suppress the electron overflow into the p-type layer, it is necessary to raise the energy barrier in the conduction band of the p-type clad layer forming the double hetero junction structure. In a gallium-nitride-group compound semiconductor light-emitting device as shown in FIG. 5, for example, the energy barrier in the conduction band can be raised by increasing the Al composition in the p-type clad layer 15 formed of AlGaN.

However, if the rate of Al composition in the p-type clad layer 15 is increased, the energy barrier against hole at valence band in the junction between the p-type clad layer 15 and the p-type contact layer 16 formed of GaN tends to go higher; which can be understood easily from the band structure shown in FIG. 6. When the energy barrier against hole in the junction between p-type clad layer 15 and p-type contact layer 16 is high, an excessive voltage-drop is caused to lower the energy barrier when a driving voltage is applied to obtain a light emission. Accordingly, the operating voltage of the light-emitting device becomes high. The present invention addresses the problem, and aims to form a gallium-nitride-group compound-semiconductor light-emitting device that provides a lowered operating voltage and an increased light emission output altogether. Using such light-emitting devices enables to offer an outdoor display device of a superior visibility.

SUMMARY OF THE INVENTION

A gallium-nitride-group compound-semiconductor light-emitting device is formed by stacking an n-type clad layer, a light-emitting layer and a p-type clad layer of galliumnitride-group compound semiconductor on a substrate in the order. The composition distribution of the gallium-nitride-group compound semiconductor in the p-type clad layer is varied along the direction of layer thickness so as the forbidden band width (same as the band gap energy) gradually decreases along with the increasing distance from the light-emitting layer.

With the above described structure, the energy barrier against electron overflow can be made high, and at the same time the excessive voltage-drop in the junction between the p-type clad layer and the p-type contact layer can be alleviated. Therefore, the light-emitting power of a light-emitting device is increased, while the operating voltage is retained low.

DESCRIPTION OF PREFERRED EMBODIMENTS

A first exemplary embodiment of the present invention is described below referring to FIG. 1 and FIG. 2.

Figure 1:
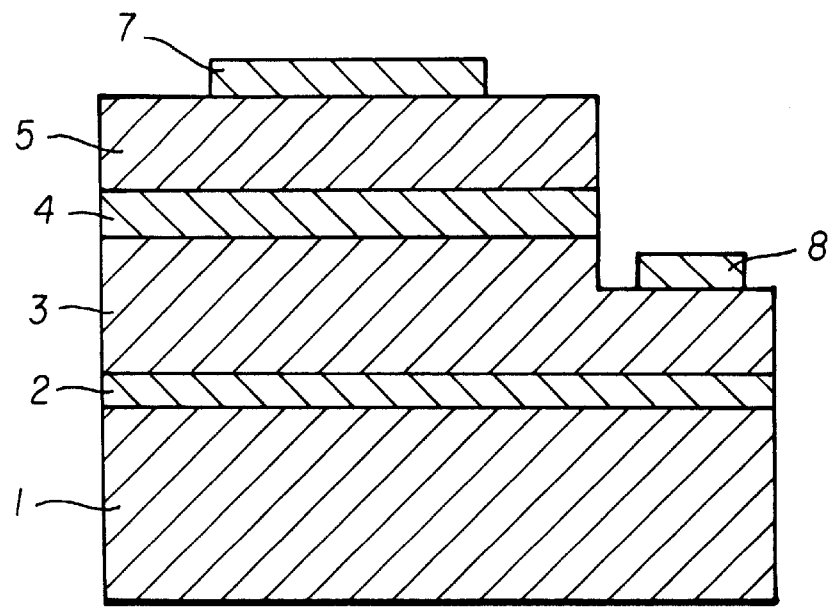
FIG. 1 is a vertical cross sectional view showing the structure of a gallium-nitride-group compound semiconductor light-emitting device in accordance with a first exemplary form of implementing the present invention.

In FIG. 1, a buffer layer 2 is formed on a substrate 1. On the surface of buffer layer 2, an n-type clad layer 3, a light-emitting layer 4, a p-type clad layer 5 are stacked in the order from the bottom. The substrate 1 may be formed of sapphire, SiC, etc. The buffer layer 2 may be formed of GaN, AlGaN, AlN, AlInN, etc. The n-type clad layer 3 may be formed of AlGaN, GaN, AlInGaN, etc. The n-type clad layer 3 has a double-layered structure composed of a first n-type clad layer of GaN, or the like material, and a second clad layer of AlGaN, or the like material. The first n-type clad layer may be formed as an n-type contact layer for providing an electrode.

An n-side electrode 8 and a p-side electrode 7 are formed, respectively, on the n-type clad layer 3 and the p-type clad layer 5. The n-side electrode 8 may be formed of aluminum (Al), titanium (Ti), or the like metal. The p-side electrode 7 may be formed of a metal such as nickel (Ni), platinum (Pt), gold (Au), tantalum (Ta), aluminum (Al), etc. Each of the p-side electrode 7 and the n-side electrode 8 is formed through a photolithography and a metal vapor deposition process.

A p-type clad layer 5 of the present invention has such a distribution of the composition in which the forbidden band width is wide in the side adjacent to the light-emitting layer 4, whereas the forbidden band width is narrow in the other side away from the light-emitting layer 4. Namely, the p-type clad layer 5 has a composition ratio as represented by a composition formula $Al_x In_y Ga_{1-x-y} N$ ($0<x<1$, $0\leq y<1$); in which the Al composition x and the In composition y are gradually varied continuously, either simultaneously or separately, so as the clad layer has a large forbidden band width in the side adjacent to the light-emitting layer 4, while it goes smaller along with the increasing distance from the light-emitting layer 4.

By making the forbidden band width of the p-type clad layer 5 larger at the side adjacent to the light-emitting layer 4, the overflow of electron injected from the n-type clad layer 3 side into the light-emitting layer 4 towards the p-type layer side may be effectively suppressed. By so doing, the efficiency of electron injection into the light-emitting layer 4 is improved.

Figure 6:
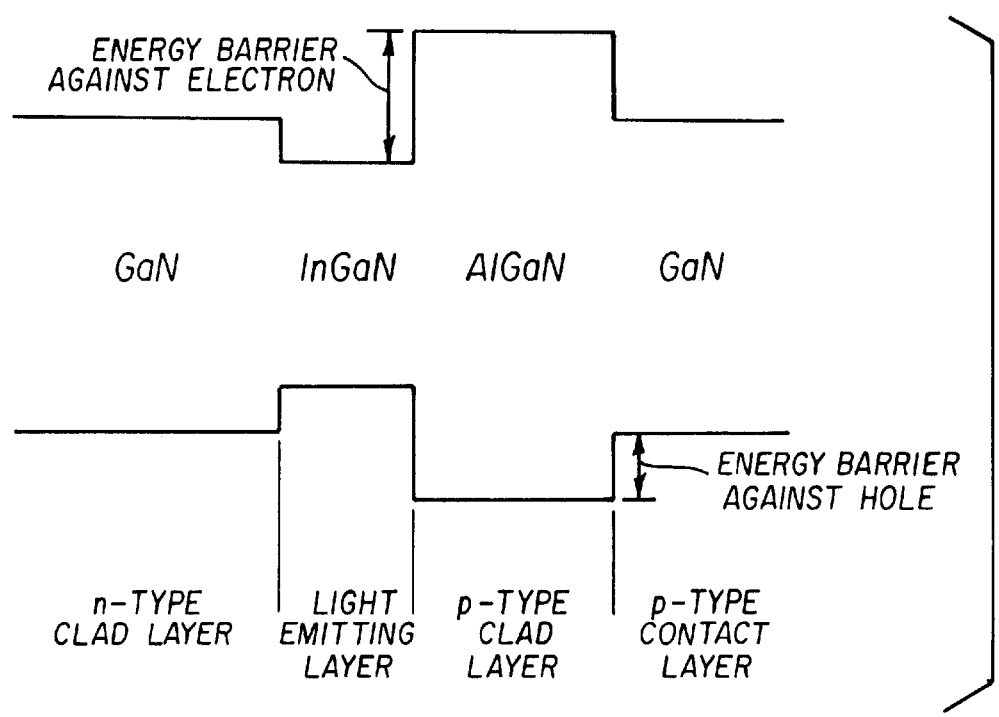
FIG. 6 shows a band structure of the light-emitting device of FIG. 5.

On the other hand, in a case where the p-type clad layer 15 is formed of a gallium-nitride-group compound-semiconductor having a single ratio of composition distribution, which is the conventional structure, the width of the forbidden band remains the same, as shown in FIG. 6, through the whole area from the junction area of light-emitting layer 14 to the junction area of p-type contact layer 16, where a p-side electrode 17 is formed. This means the energy barrier against hole with respect to the p-type contact layer 16 is high. In the present invention, the composition ratio of Al, In, Ga can be varied by shifting the values x, y of the composition formula $Al_x In_y Ga_{j-x-y} N$ ($0<x\leq 1$, $0<y<1$).

Figure 2:
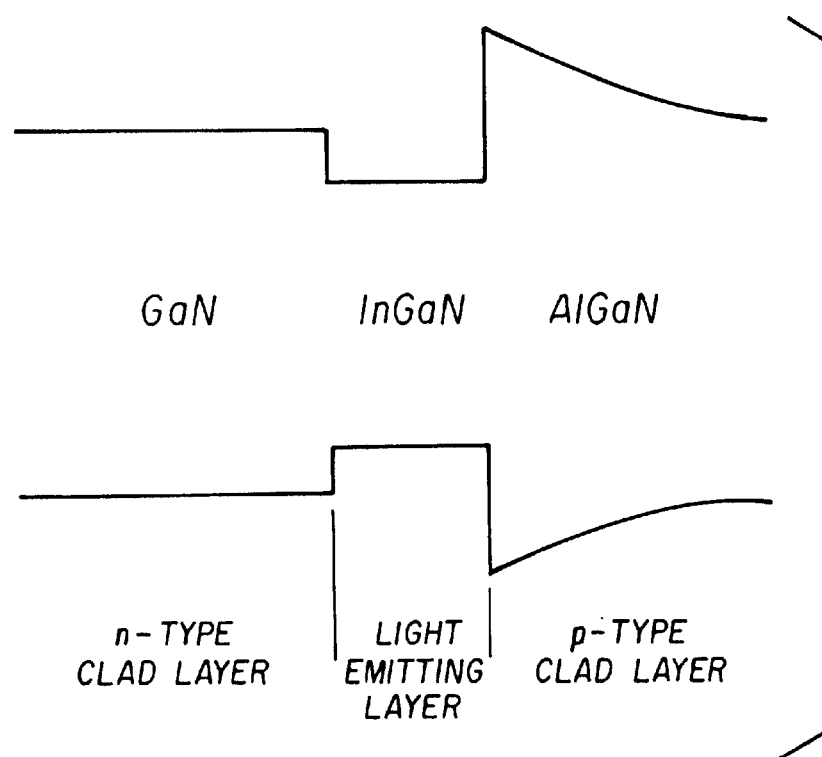
FIG. 2 shows a band structure of the light-emitting device of FIG. 1.

Namely, a continuous shift in the respective compositions of Al, In and Ga enables to form a p-type clad layer 5 whose forbidden band width smoothly decreases along with the increasing distance from the light-emitting layer 4, as shown in the band structure of FIG. 2. The narrowed forbidden bandwidth at the hole injection side lowers the energy barrier against hole. The hole can be transferred smoothly within the p-type clad layer 5 to be injected into the light-emitting layer 4. Therefore, the excessive voltage-drop at the p-type clad layer 5 will not occur, and the operating voltage can be reduced.

Further, in providing an electrode on the surface of the p-type clad layer 5, which has a narrowing forbidden band width towards the side away from the light-emitting layer 4, the contact resistance with metal may not be significantly high. Therefore, a p-side electrode 7 may be formed direct on the surface of the p-type clad layer 5; or, the p-type clad layer 5 can be used also as a contact layer for forming an electrode. The elimination of a p-type contact layer to be formed on the surface of the p-type clad layer 5 contributes to eliminate a voltage-drop at the p-type contact layer.

It is preferred that the light-emitting layer 4 has a composition satisfying a formula $In_a Ga_{1-a} N$ ($0<a\leq 1$), without having any Al content. One reason is that the inclusion of Al content is liable to cause a deterioration in the crystalline property inviting a lowered light-emitting efficiency. Another reason is that the formation of a heterojunction region with the p-type clad layer 5 and the light-emitting layer having the composition $In_a Ga_{1-a} N$ ($0<a\leq 1$) efficiently raises the energy barrier against electron in the conduction band of p-type clad layer 5 at the side adjacent to the light-emitting layer 4. This results in an efficient injection of electron into the light-emitting layer 4, which makes another contribution to an increased efficiency of light emission.

A second exemplary embodiment of the present invention is described in the following with reference to FIG. 3 and FIG. 4. Those members having the same function as in the first exemplary embodiment are represented by providing the same symbols, and the detailed description regarding those members is not repeated here.

The point of difference in the structure as compared with that of FIG. 1 is that the composition distribution in p-type clad layer 5, $Al_x In_y Ga_{1-x-y} N$ (0<x<1, 0≦y<1), has been changed so as the forbidden band width decreases in a stepping mode along with an increasing distance from the light-emitting layer 4. Another point of difference is the formation of a p-type contact layer 6 between the p-type clad layer 5 and the p-side electrode 7.

The p-type contact layer 6 is formed with a composition distribution, $Al_u In_v Ga_{1-u-v} N$ (0≦u<1, 0≦v<1, u≦v).

Especially, the Al composition u and the In composition v in the p-type contact layer 6 are selected so as the quantity of valence band energy discontinuity in the junction between p-type clad layer 5 and p-type contact layer 6 is not higher than 0.1 eV. If the valence band energy discontinuity in the junction between p-type clad layer 5 and p-type contact layer 6 is higher than 0.1 eV. the barrier against the hole injected from the p-type contact layer 6 goes high, and the excessive voltage-drop at the junction is caused, leading to a high operating voltage of a device.

A p-type contact layer 6 having the same composition distribution s described in the present second embodiment may be provided also in a gallium-nitride-group compound semiconductor light-emitting device of the first embodiment shown in FIG. 1; between the p-type clad layer 5 and the p-side electrode 7.

Figure 4:
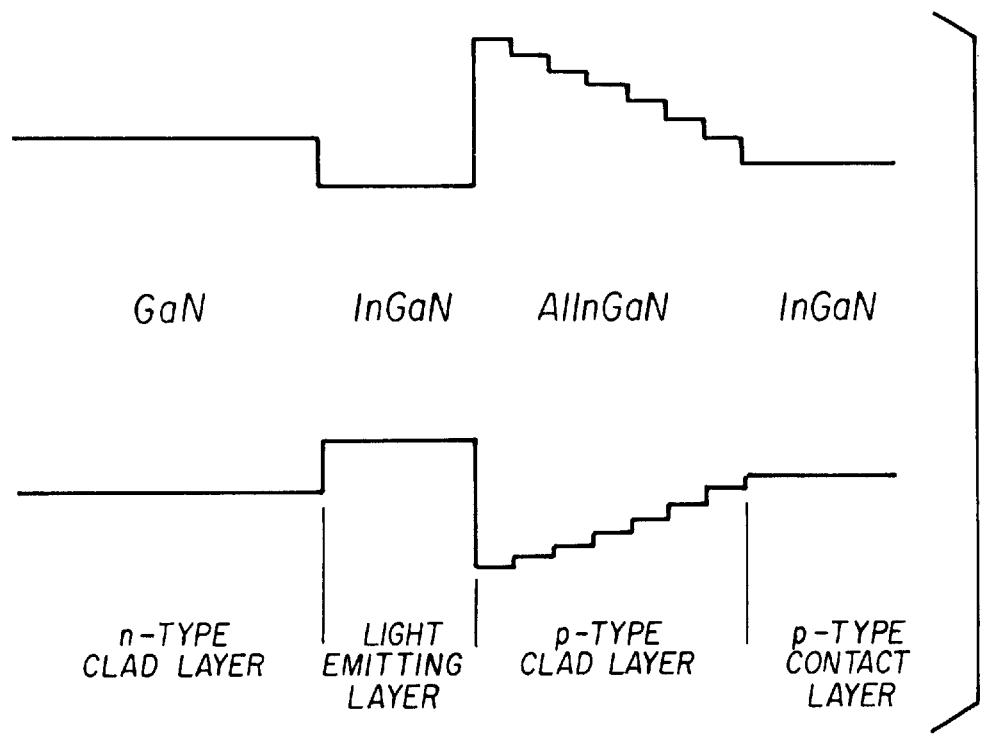
FIG. 4 shows a band structure of the light-emitting device of FIG. 3.

As shown in FIG. 4, an illustration of the band structure, the composition distribution in p-type clad layer 5 is varied so as the forbidden band width decreases in a stepping mode along with the increasing distance from the light-emitting layer 4. The energy discontinuity in valence band at a step of the stepping convergence of p-type clad layer 5 should preferably be identical to that of thermal energy of the room temperature (approx. 0.026 eV), or smaller. This is because of a fact that the hole is transferred smoothly within the p-type clad layer 5 when the energy discontinuity within p-type clad layer 5 is small.

With the same effects as observed in the light-emitting device of FIG. 1, where the composition distribution in p-type clad layer was continuously varied, the excessive voltage-drop in the p-type clad layer 5 is eliminated also in the present exemplary embodiment. Namely, with the forbidden band width gradually narrowing, the hole is transferred smoothly within the p-type clad layer 5 and is injected into the light-emitting layer 4; so, an excessive voltage-drop scarcely occurs within the p-type clad layer 5.

Now in the following, practical examples of the present invention are described with reference to FIG. 1 and FIG. 3. These semiconductor light-emitting devices have been manufactured by employing a method for growing gallium-nitride-group compound semiconductor using a metalo-organic chemical vapor deposition process.

EXAMPLE 1

A sapphire substrate 1 having a mirror-polished surface is set on a substrate holder within a reaction tube. The substrate 1 is maintained at 1100° C. on the surface for 10 min., and is cleaned to remove organic substance and other stains as well as the humidity sticking on the surface by heating the substrate in hydrogen gas flow.

Then, the surface temperature of substrate 1 is lowered down to 600° C., and a buffer layer 2 of AlN is grown in the thickness of 25 nm by providing nitrogen gas, as the main carrier gas, at 10 liter/min., ammonia at 5 liter/min. and a TMA carrier gas at 20 cc/min.

Supply of the TMA carrier gas is discontinued and the temperature is raised up to 1050° C. Then, while continuing the flow of nitrogen gas at 9 liter/min. and hydrogen gas at 0.95 liter/min., following gases are newly provided, namely, a TMG carrier gas at 4 cc/min., a 10 ppm $SiH_4$ (mono-silane) gas, as the source of Si, at 10 cc/min. for a duration of 60 min. in order to grow an n-type clad layer 3 of Si doped GaN on the buffer layer 2 in the thickness of approximately 2 $\mu$m.

After the n-type clad layer 3 is grown and formed, the supply of TMG carrier gas and $SiH_4$ gas is discontinued, the surface temperature of substrate is lowered down to 750° C., and then following gases are newly provided; nitrogen gas, as the main carrier gas, at 10 liter/imin., a TMG carrier gas at 2 cc/min., and a TMI carrier gas at 200 cc/min. for a duration of 100 sec. in order to grow a light-emitting layer 4 of InGaN in the thickness of 10 nm.

After the light-emitting layer 4 is formed, the supply of TMI carrier gas and TMG carrier gas is discontinued, surface temperature of the substrate 1 is raised up to 1050° C., and then following gases are newly provided; nitrogen gas, as the main carrier gas, at 9 liter/min., hydrogen gas at 0.90 liter/ min., a TMG carrier gas at 4 cc/min., a TMA carrier gas, a carrier gas of bis-cyclo-pentadienyel-magnesium ($Cp_2Mg$), or the Mg source, at 60 cc/min. for a duration of 4 min. in order to grow a p-type clad layer 5 of Mg doped AlGaN in the thickness of 0.1 $\mu$m. During the above period, flow of the TMA carrier gas is varied linearly from 6 cc/min. to 0.1 cc/min. By so doing, a p-type clad layer 5 of AlGaN is formed, which layer having a composition distribution varying from $Al_{o.15} Ga_{0.85} N$ to $Al_{0.01} Ga_{0.99} N$, at the side adjacent to the light-emitting layer 4 to the side away from the light-emitting layer 4. After the p-type clad layer 5 is formed, supply of the TMG carrier gas, the TMA carrier gas, the $Cp_2Mg$ carrier gas and the ammonia is discontinued. The flow of nitrogen gas and hydrogen gas is kept at the same flow rate until the wafer is cooled down to the room temperature. The wafer is taken out of the reaction tube.

On the surface of a substance of stacked layers of gallium-nitride-group compound semiconductor containing a pn junction structured through the above-described procedure, a $SiO_2$ film is deposited by a CVD process. An etching mask is provided by patterning the film through a photolithographic process. The p-type clad layer 5 and the light-emitting layer 4 are partially etched-off by a reactive ion etching method in the depth of approximately 0.15 $\mu$m to expose the surface of n-type clad layer 3. On the exposed surface of n-type clad layer 3, an n-side electrode 8 of Al is formed by deposition. In the same way, a -p-side electrode 7 of Ni and Au is formed on the surface of p-type clad layer 5.

The sapphire substrate 1 is polished in the reverse surface down to approximately 100 $\mu$m thick, and separated into chips by scribing. This completes a light-emitting device of FIG. 1.

A separated chip of gallium-nitride-group compound-semiconductor light-emitting device is attached on a stem with the surface having the electrode up. The respective n-side electrode 8 and p-side electrode 7 on the chip are connected with wire to corresponding electrodes of the stem, and the whole structure is resin-molded to complete a light-emitting diode. When the light-emitting diode is driven with a 20 mA forward current, it emitted a blue light of 470 nm wavelength; the spectral half-width was 17 nm, the luminous output 1150 $\mu$W, the forward operating voltage 3.4 V.

EXAMPLE 2

In the same way as in example 1, a buffer layer 2 of AlN, an n-type clad layer 3 of Si doped GaN and a light-emitting layer 4 of InGaN are stacked on a substrate 1.

After the light-emitting layer 4 is formed, supply of the TMI carrier gas and the TMG carrier gas is discontinued, temperature of the substrate 1 is raised up to 1050° C., and then following gases are newly provided; nitrogen gas, as the main carrier gas, at 9 liter/min., hydrogen gas at 0,90 liter/ min., a TMG carrier gas at 4 cc/min., a TMA carrier gas, a TMI carrier gas, a carrier gas of $Cp_2Mg$, or the Mg source, at 60 cc/min. for a duration of 4 min. in order to grow a p-type clad layer 5 of Mg doped AlInGaN in the thickness of 0.1 μm. During the above period, flow of the TMA carrier gas is gradually varied in the stepping mode from 6 cc/min. to 0.1 cc/min., and flow of the TMI carrier gas is gradually varied in the stepping mode from 0.1 cc/min. to 50 cc/min. By so doing, a p-type clad layer 5 of AlInGaN is formed, which layer having a composition distribution varying in the stepping mode from $Al_{0.15} In_{0.01} Ga_{0.84} N$ to $Al_{0.01} In_{0.05} Ga_{0.94} N$, from the side adjacent to the light-emitting layer 4 towards the side away from the light-emitting layer 4.

After the p-type clad layer 5 is formed, supply of the TMA carrier gas, the TMI carrier gas and the TMG carrier gas is discontinued, temperature of the substrate is lowered down to 800° C., and then following gases are newly provided; nitrogen gas, as the main carrier gas, at 10 liter/min., a TMG carrier gas at 2 cc/min., a TMI carrier gas at 50 cc/min. and a carrier gas of $Cp_2Mg$ at 20 cc/min. for a duration of 5 min. in order to grow a p-type contact layer 6 of $In_{0.05} Ga_{0.95} N$ in the thickness 0.2 μm.

After the p-type contact layer 6 is formed, supply of the TMG carrier gas, the TMI carrier gas, the carrier gas of $Cp_2Mg$ and the ammonia is discontinued. The flow of nitrogen gas and hydrogen gas is kept at the same flow rate until the wafer is cooled down to the room temperature. The wafer is taken out of the reaction tube.

On the surface of a substance of stacked layers of gallium-nitride-group compound-semiconductor containing a pn junction structured through the above described procedure, a $SiO_2$ film is deposited by a CVD process. An etching mask is provided by patterning the film through a photolithographic process. The p-type contact layer 6, the p-type clad layer 5 and the light-emitting layer 4 are partially etched-off by a reactive ion etching method in the depth of approximately 0.35 μm to expose the surface of n-type clad layer 3. On the exposed surface of n-type clad layer 3, an n-side electrode 8 of Al is provided by deposition. In the same way, a p-side electrode 7 of Ni and Au is provided on the surface of p-type clad layer 5.

Figure 3:
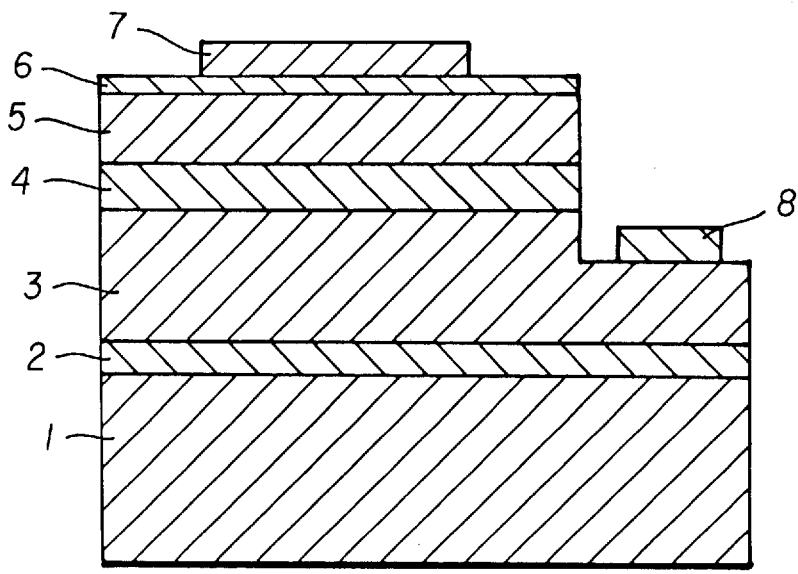
FIG. 3 is a vertical cross sectional view showing the structure of a gallium-nitride-group compound-semiconductor light-emitting device in accordance with a second exemplary form of implementing the present invention.

The substrate 1 is polished and separated into chips by scribing, in the same way as in example 1, to obtain a light-emitting device of FIG. 3. A light-emitting diode is fabricated from the light-emitting device in the same way as in example 1. When the light-emitting diode is driven with a 20 mA forward current, it emitted a blue light of 470 nm wavelength; the spectral half-width was 18 nm, the luminous output 1100 μW, the forward operating voltage 3.3 V.

In the present example described above, the flow of the material gases for Group III element, TMG, TMA and TMI carrier gases, was gradually varied in a stepping mode during the growth of p-type clad layer 5, in order to form a p-type clad layer 5 with which the composition distribution is changing in a stepping mode. Instead, the p-type clad layer 5 may also be provided in the continuously changing composition distribution mode by varying the flow of material gas for Group III element linearly, in the same way as in example 1.

Comparative Example

As a comparative specimen, a buffer layer 2, an n-type clad layer 3 and a light-emitting layer 4 are stacked on a substrate 1 in the same way as in example 1. After the light-emitting layer 4 is formed, supply of the TMI carrier gas and the TMG carrier gas is discontinued, the surface temperature of substrate 1 is raised up to 1050° C., and then following gases are newly provided; nitrogen gas, as the main carrier gas, at 9 liter/min., hydrogen gas at 0.90 liter/min., a TMG carrier gas at 4 cc/min., a TMA carrier gas at 7 cc/min., a carrier gas for $Cp_2Mg$ at 60 cc/min., for a duration of 4 min., in order to form a p-type clad layer 5 of Mg doped $Al_{0.15} Ga_{0.85} N$ in a depth of 0.1 μm.

After the p-type clad layer 5 is formed, supply of the TMA carrier gas, the TMG carrier gas and the carrier gas of $Cp_2Mg$ is discontinued, and then keeping the temperature at 1050° C. following gases are newly provided; nitrogen gas, as the main carrier gas, at 9 liter/min., hydrogen gas at 0.90 liter/min., a TMG carrier gas at 4 cc/min. and a carrier gas of $Cp_2Mg$ at 100 cc/min., for a duration of 3 min. in order to grow a p-type contact layer 6 of Mg doped GaN in the thickness of 0.1 μm.

After the p-type contact layer 6 is formed, supply of the TMG carrier gas, the TMA carrier gas, the carrier gas of $Cp_2Mg$ and the ammonia is discontinued. The flow of nitrogen gas and hydrogen gas is kept at the same flow rate until the wafer is cooled down to the room temperature. The wafer is taken out of the reaction tube.

Figure 5:
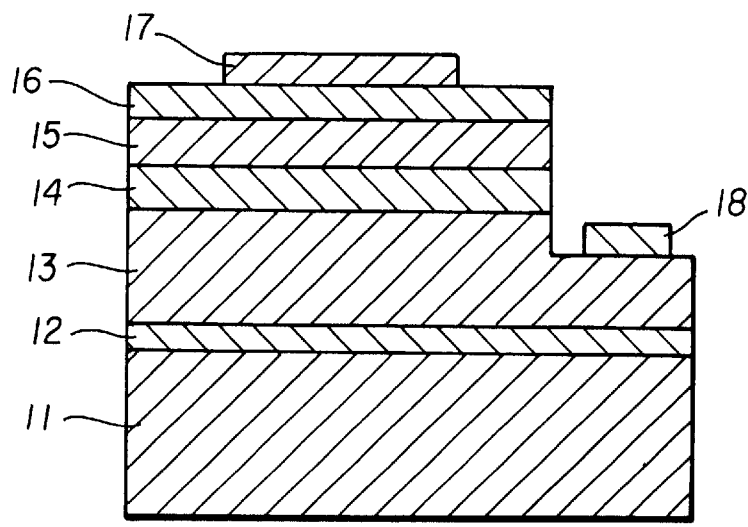
FIG. 5 is a cross sectional view showing the structure of a conventional gallium-nitride-group compound semiconductor light-emitting device.

In the same way as in embodiment 2, an n-side electrode 8 of Al is provided on the surface of the n-type clad layer 3, and a p-side electrode 7 of Ni and Au is provided on the surface of the p-type contact layer 6. This produces a gallium-nitride-group compound-semiconductor light-emitting device of the conventional structure as shown in FIG. 5.

A light-emitting diode is fabricated in the same procedure as in embodiment 2. When the light-emitting diode is driven with a 20 mA forward current, it emitted a blue light of 470 nm wavelength. However, the spectral half-width was 21 nm, the luminous output was 820 μW, which output value being weaker than that of the above described embodiments. The forward operating voltage was as high as 4.1 V.

In the present invention, the energy barrier against the hole at valence band in a p-type clad layer can be varied continuously, or in a gradual stepping mode. This reduces the voltage-drop in the p-type clad layer. Also, in the present invention, by specifying the composition distribution of gallium-nitride-group compound semiconductor material forming the light-emitting layer and the p-type clad layer, the energy barrier against electron overflow can be maintained high. Therefore, the power consumption can be reduced, and the luminous output can be maintained high.

What is claimed is:

1. A gallium-nitride-group compound semiconductor light-emitting device comprising an n-type clad layer, a light-emitting layer and a p-type clad layer of gallium-nitride-group compound semiconductor stacked in the order on a substrate, wherein said light-emitting layer is formed of $In_a Ga_{1-a} N$ ($0<a \leq 1$), said p-type clad layer is formed of $Al_x In_y Ga_{1-x-y} N$ ($0<x<1$, $0 \leq y<1$), of which a composition distribution is varied in a direction of layer thickness so as a forbidden band width gradually decreases along with an increasing distance from said light-emitting layer, and a p-side electrode is formed in contact with said p-type clad layer.

2. The gallium-nitride-group compound semiconductor light-emitting device of claim 1, wherein a varying rate in the composition distribution of said gallium-nitride-group compound-semiconductor in the direction of layer thickness stays substantially constant.

3. The gallium-nitride-group compound semiconductor light-emitting device of claim 1, wherein a varying rate in the composition distribution of said gallium-nitride-group compound-semiconductor in the direction of layer thickness varies at a discontinuous rate.

4. The gallium-nitride-group compound semiconductor light-emitting device of claim 3, wherein the forbidden band width gradually decreases with a convergence at 0.026 eV or less.

5. A gallium-nitride-group compound semiconductor light-emitting device comprising an n-type clad layer, a light-emitting layer and a p-type clad layer of gallium-nitride-group compound semiconductor stacked in the order on a substrate, wherein said light-emitting layer is formed $In_a Ga_{1-a} N$ ($0<a\leq 1$), said p-type clad layer is formed of $Al_x In_y Ga_{1-x-y} N$ ($0<x<1$, $0\leq y<1$), of which a composition distribution is varied in a direction of layer thickness so as a forbidden band width gradually decreases along with an increasing distance from said light-emitting layer, a p-type contact layer of p-type $Al_u In_v Ga_{1-u-v} N$ ($0\leq u<1$, $0\leq v<1$, $u\leq v$) is formed in contact with said p-type clad layer, a p-side electrode is formed in contact with said p-type contact layer, and a quantity of energy discontinuity at valence band in a junction between said p-type clad layer and said p-type contact layer is not higher than 0.1 eV.

6. The gallium-nitride-group compound semiconductor light-emitting device of claim 5, wherein a varying rate in the composition distribution of said gallium-nitride-group compound-semiconductor in the direction of layer thickness stays substantially constant.

7. The gallium-nitride-group compound semiconductor light-emitting device of claim 5, wherein a varying rate in the composition distribution of said gallium-nitride-group compound-semiconductor in the direction of layer thickness varies at a discontinuous rate.

8. The gallium-nitride-group compound semiconductor light-emitting device of claim 7, wherein the forbidden band width gradually decreases with a convergence at 0.026 eV or less.

* * * * *